US006545466B2

(12) United States Patent
Sawa et al.

(10) Patent No.: US 6,545,466 B2

(45) Date of Patent: Apr. 8, 2003

(54) MAGNETIC POWDER FOR VALIDITY DETERMINING INK, MANUFACTURING METHOD FOR MAGNETIC POWDER FOR VALIDITY DETERMINING INK, MAGNETIC INK FOR VALIDITY DETERMINATION, PRINTING MEMBER FOR VALIDITY DETERMINATION, DETECTING DEVICE FOR PRINTING MEMBER FOR VALIDITY DETERMINATION, AND VALIDITY DETERMINATION DEVICE

(75) Inventors: Takao Sawa, Kanagawa-ken (JP); Katsutoshi Nakagawa, Kanagawa-ken (JP); Teruo Murakami, Kanagawa-ken (JP); Tadahiko Kobayashi, Kanagawa-ken (JP); Hisashi Takahashi, Kanagawa-ken (JP); Masao Obama, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 44 days.

(21) Appl. No.: 09/801,750

(22) Filed: Mar. 9, 2001

(65) Prior Publication Data

US 2001/0022259 A1 Sep. 20, 2001

(30) Foreign Application Priority Data

Mar. 17, 2000 (JP) ....................................... 2000-075850

(51) Int. Cl.[7] ................................................ G01R 33/12

(52) U.S. Cl. .................................. 324/212; 194/302

(58) Field of Search ................................ 824/212, 210, 824/224, 200; 380/54; 382/320; 194/302; 235/449

(56) References Cited

U.S. PATENT DOCUMENTS

| | | | | | |
|---|---|---|---|---|---|
| 4,081,132 | A | | 3/1978 | Pearce | |
| 4,396,886 | A | * | 8/1983 | Koester et al. | 324/212 |
| 5,533,759 | A | * | 7/1996 | Jefers | 283/70 |
| 6,396,927 | B1 | * | 7/2002 | Philips | 380/54 |

FOREIGN PATENT DOCUMENTS

| | | | |
|---|---|---|---|
| DE | 4103263 | A1 | 8/1992 |
| EP | 0 291 306 | | 11/1988 |
| EP | 0702339 | A1 | 3/1996 |

OTHER PUBLICATIONS

Database WPI, Section Ch, Week 198549, Derwent Publications Ltd., 1985, XP002197167.

* cited by examiner

*Primary Examiner*—Edward Lefkowitz
*Assistant Examiner*—Subhash Zaveri
(74) *Attorney, Agent, or Firm*—Pillsbury Winthrop LLP

(57) ABSTRACT

The magnetic powder for validity determining ink is composed of magnetic oxide power having a Curie temperature between −50°C. and 150°C. and a mean powder particle diameter of 10 $\mu$m or less.

6 Claims, 5 Drawing Sheets

RELATIONSHIP BETWEEN Zn QUANTITY AND Curie TEMPERATURE

MAGNETIC POWDER FOR VALIDITY DETERMINING INK, MANUFACTURING METHOD FOR MAGNETIC POWDER FOR VALIDITY DETERMINING INK, MAGNETIC INK FOR VALIDITY DETERMINATION, PRINTING MEMBER FOR VALIDITY DETERMINATION, DETECTING DEVICE FOR PRINTING MEMBER FOR VALIDITY DETERMINATION, AND VALIDITY DETERMINATION DEVICE

BACKGROUND OF THE INVENTION

1. Field of the Invention

The present invention relates to magnetic powder for validity determining ink, a manufacturing method for magnetic powder for validity determining ink, magnetic ink for validity determination, a printing member for validity determination, a detecting device for the printing member for validity determination, and a validity determining device which are applied to printing of, for example, health insurance cards and ID cards having intrinsic numbers respectively, Shinkansen reserved tickets issued by travel agencies and ticket centers, tickets having the value printed on specific forms such as concert tickets, and securities such as bank tickets, bills, stocks, and gift certificates.

2. Description of the Related Art

Forgery preventive measures for notes as money, securities, and cards having the value equal to cash are taken. Particularly, an art for printing a certain kind of information on a paper sheet with magnetized ink and magnetically detecting the information is easy in recording and erasing information and used widely. Further, recently, for example, as disclosed in U.S. Pat. No. 5,533,759 (Jeffers, Jul. 9, 1996), an objective document is printed using magnetic ink including a magnetic pigment having a Curie temperature lower than 130° C. and the printed part is magnetized in an optional magnetic pattern. The magnetized part is heated at least up to 130° C. using a heat lamp. The validity of the document is determined depending on whether the magnetic pattern is destroyed by heat in the temperature region beyond the Curie point or not. However, in U.S. Pat. No. 5,533,759 mentioned above, the particle diameter of the magnetic pigment included in the magnetic ink is not disclosed. When the particle diameter of the magnetic pigment is larger than a predetermined value, the magnetic pigment cannot respond sufficiently to the high resolution like printing by an ink jet printer. Further, when the particle diameter of the magnetic pigment is larger than a predetermined value and the magnetic pigment is printed on a paper sheet, particularly the magnetic information recorded on the surface is gradually torn off due to friction with the magnetic detection head during reading and it is anxious that the SN ratio may be reduced during reading of the information.

On the other hand, as input-output devices such as scanners, printers, and copying machines, personal computers, and image processing software have been highly advanced recently, even devices on sale can commit highly precise forge. In order to respond to this situation, various forgery preventive arts are applied to securities and individual authentication ID cards. Particularly, from the viewpoint of that information is invisible to a human, arts using a magnetic material are widely used. For example, in securities, an art for printing a predetermined area with magnetic ink with magnetic powder mixed and determining the validity by detecting the existence of magnetism or the magnetic pattern itself is known. Further, in IC cards, it is known to magnetically record information on a magnetic stripe, reproduce it, and authenticate an individual.

As mentioned above, generally, output detection by magnetism can respond to determination of the validity by high-speed reading comparatively easily, so that it has been used in various fields. However, the conventional method determines the validity depending on judgment of whether there is magnetic information in a predetermined position or not, so that using a material of $Fe_3O_4$ or others which can be obtained comparatively easily, forging arts using the latest printing art are generated frequently.

In the aforementioned magnetic forgery preventive art, a recording and reproducing apparatus can be prepared comparatively simply and can read recorded information easily, so that an art having weak resisting force to forgery and a high security property is required.

SUMMARY OF THE INVENTION

An object of the present invention is to obtain magnetic powder for validity determining ink which is satisfactory in output and durability, applicable to various printing arts, and high in the reliability, determining speed, and forgery preventive effect.

Another object of the present invention is to provide a manufacturing method for magnetic powder for validity determining ink which is satisfactory in the durability, applicable to various printing arts, high in the reliability, determining speed, and forgery preventive effect, and easily capable of obtaining a desired particle diameter.

Furthermore, still another object of the present invention is to provide magnetic ink for validity determination that is satisfactory in the durability, applicable to various printing arts, and high in the reliability, determining speed, and forgery preventive effect.

A further object of the present invention is to provide a printing member for validity determination that is satisfactory in the durability and high in the reliability, determining speed, and forgery preventive effect.

A still further object of the present invention is to provide a detecting device for a printing member for validity determination that is high in the reliability, determining speed, and forgery preventive effect.

Yet a further object of the present invention is to provide a validity-determining device for a printing member for validity determination that is high in the reliability, determining speed, and forgery preventive effect.

According to the present invention, magnetic powder for validity determining ink comprising magnetic oxide powder having a Curie temperature between −50° C. and 150° C. and a mean powder particle diameter of 10 $\mu$m or less is provided.

Furthermore, according to the present invention, a manufacturing method for magnetic powder for validity determining ink is provided and the manufacturing method comprises the steps of dissolving a magnetic oxide and a glass forming material to obtain a mixture thereof; cooling the mixture rapidly to make the amorphous magnetic oxide; heat-treating the amorphous mixture to crystallize the magnetic oxide; and removing the glass forming material from the crystallized mixture to obtain magnetic oxide powder having a mean crystal particle diameter of 10 $\mu$m or less.

Further, according to the present invention, magnetic ink for validity determination including first magnetic powder having a first Curie temperature between −50° C. and 150° C. and a mean powder particle diameter of 10 μm or less is provided.

Furthermore, according to the present invention, a printing member for validity determination is provided and the printing member for validity determination comprises a base; a first magnetic image printed on the base with the first magnetic ink including first magnetic powder having a first Curie temperature; and a second magnetic image printed on the base with second magnetic ink including second magnetic powder having a second Curie temperature higher than that of the first magnetic powder.

Further, according to the present invention, a detecting device for a printing member for validity determination is provided and the detecting device comprises means for conveying a printing member for validity determination having the first magnetic image printed with the first magnetic ink including the first magnetic powder having the first Curie temperature and the second magnetic image printed with the second magnetic ink including the second magnetic powder having the second Curie temperature higher than that of the first magnetic powder; a heater for heating the printing member for validity determination to a temperature higher than the first Curie temperature and lower than the second Curie temperature; and magnetic characteristic detecting means for detecting magnetic characteristics from the heated printing member for validity determination.

Furthermore, according to the present invention, a validity determining device is provided and the validity determining device comprises means for conveying a printing member for validity determination having the first magnetic image printed with the first magnetic ink including the first magnetic powder having the first Curie temperature and the second magnetic image printed with the second magnetic ink including the second magnetic powder having the second Curie temperature higher than that of the first magnetic powder; a heater for heating the printing member for validity determination to a temperature higher than the fist Curie temperature and lower than the second Curie temperature; a first magnetic detecting section installed at the preceding stage of the heater for detecting magnetic characteristics from the printing member for validity determination; a second magnetic detecting section installed at the later stage of the heater for detecting magnetic characteristics from the printing member for validity determination; and a validity determining section for determining the validity of the printing member for validity determination from a first detected magnetic pattern detected by the first magnetic detecting section and a second detected magnetic pattern detected by the second magnetic detecting section.

DETAILED DESCRIPTION OF THE PREFERRED EMBODIMENTS

Figure 1:
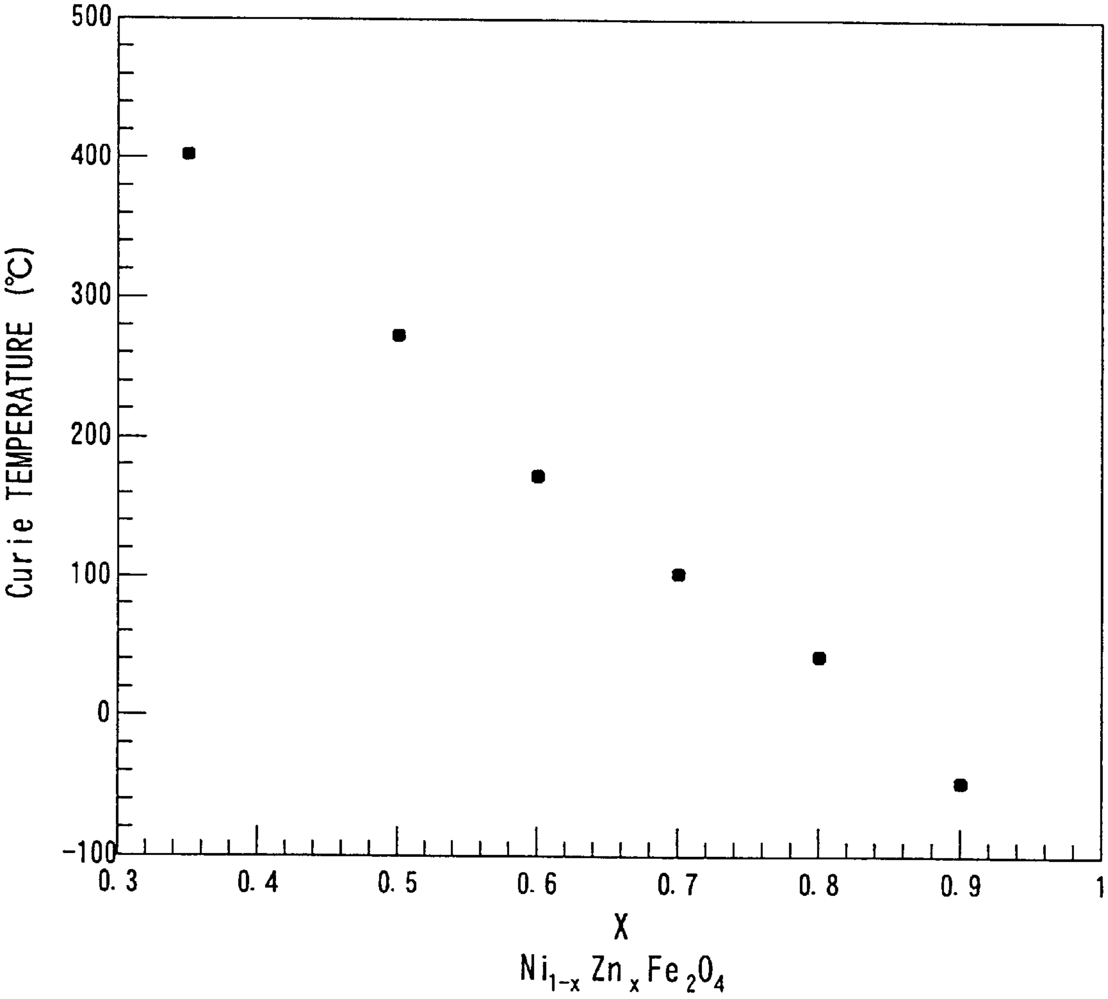
FIG. 1 is a graph showing the relationship between the Zn substitution ratio X of NiZn ferrite series magnetic powder used in the present invention with the Curie temperature.

The magnetic powder for validity determining ink of the present invention is practically composed of magnetic oxide powder and the magnetic oxide powder has a Curie temperature between −50° C. and 150° C. and a mean crystal particle diameter of 10 μm or less.

Further, the manufacturing method for magnetic power for validity determining ink of the present invention indicates an example of the manufacturing method for the aforementioned magnetic powder and includes a step of mixing and dissolving a magnetic oxide and a glass forming material, a step of cooling the obtained mixture rapidly and making the amorphous magnetic oxide, a step of heat-treating the cooled mixture thereafter and crystallizing the magnetic oxide, and a step of removing the glass forming material from the mixture and obtaining magnetic oxide powder with a mean powder particle diameter of 10 μm or less.

Furthermore, the ink for validity determination of the present invention contains the aforementioned magnetic powder, that is, magnetic oxide powder having a Curie temperature between −50° C. and 150° C. and a mean powder particle diameter of 10 μm or less.

As mentioned above, the present invention uses magnetic oxide powder with a mean powder particle diameter of 10 μm or less.

When the particle diameter of magnetic powder for validity determination is 10 μm or less, it is easily mixed in the fibers of the print base, for example, paper during printing and the amount of magnetic powder existing on the paper surface is reduced. By doing this, the omission of magnetic powder due to magnetic detection is greatly reduced and the durability is greatly improved. The mean powder particle diameter of magnetic powder is preferably 5 nm to 5 μm and most preferably 5 nm to 1 μm.

Further, according to the present invention, when the particle diameter is decreased, the color depth due to a pigment becomes light, so that the color can be adjusted by a combination of various pigments. Further, the dispersibility of pigments is satisfactory, so that magnetic powder in ink can be dispersed uniformly and the detection output becomes larger.

According to the present invention, as a magnetic material, from the viewpoint of durability, an oxide is used. As a constitution of an oxide, the crystal structures such as the perovskite type, garnet type, hexagonal type, and spinel type may be cited.

The mean powder particle diameter can be easily obtained by setting the maximum length of each particle as a particle diameter and averaging those of 20 or more particles obtained from the TEM observation. Or, when a calibration curve of the value and specific surface area can be obtained, the mean particle diameter can be obtained from the specific surface area.

Further, according to the present invention, the Curie temperature of magnetic powder can be used for validity determination and in the present invention, at least one kind of magnetic powder having a Curie temperature within the range from −50 to 150° C. is used. The reason is that when magnetic powder having a Curie temperature within the range from −50 to 150° C. is used, by changing the temperature comparatively easily, the magnetic detection output is greatly changed and best reversibility of detection output is obtained. By doing this, reliable validity determination can be executed simply.

Furthermore, within this temperature range, the magnetic permeability at just the Curie temperature is very high and the detection sensitivity is extremely satisfactory. On the other hand, when the Curie temperature is higher than 150° C., the surface temperature is easily varied and a place where the output is changed and a place where no output is changed may be generated due to it, so that accurate binary coding becomes difficult. On the other hand, when the Curie temperature is lower than −50° C., the magnetic permeability of magnetic powder is reduced, so that the output itself is reduced and the variation in the neighborhood of the Curie temperature is made smaller.

In the magnetic ink for validity determination of the present invention, at least one kind of another magnetic powder different in the Curie temperature from the magnetic powder of the present invention can be mixed additionally.

The setting of Curie temperature can be realized in the same component system under control of the composition. A different composition system having a different Curie temperature can be mixed.

Further, in the magnetic ink for validity determination of the present invention, at least one kind of still another magnetic powder different in the coercive force from the magnetic powder of the present invention can be mixed additionally.

The setting of coercive force can also be realized in the same component system under control of the composition, though a different composition system having a different coercive force can be mixed.

Magnetic oxide powder is preferable to be ferrite series magnetic powder having coercive force of 20,000 A/m or less.

It is also possible to use a combination of another magnetic powder different in the Curie temperature and still another magnetic powder different in the coercive force.

It is also possible to prepare various types of ink for validity determination including another magnetic powder and still another magnetic powder and print using them respectively.

As mentioned above, by use of a combination of several kinds of magnetic powder, printed papers having a higher security property can be provided.

As magnetic oxide powder, soft magnetic ferrite such as NiZn ferrite, MnZn ferrite, and CuZn ferrite is desirable. Further, it is desirable to replace a part of Ni ferrite and Mn ferrite with Zn so as to control the Curie temperature. Particularly, since the coercive force of magnetic powder including Ni oxide is low and the detection sensitivity is increased, it is desirable.

In FIG. 1, as an example, the relationship between the Zn substitution ratio X of NiZn ferrite ($Ni_{1-x}Zn_xFe_2O_4$) series magnetic powder preferably used in the present invention with the Curie temperature is shown.

As shown in the drawing, it is found that even if the same NiZn ferrite is used, the Curie temperature greatly varies with the component constitution. Adjusting the component constitution of an element having a Curie temperature and coercive fore within the desired ranges can use the magnetic powder used in the present invention.

At the time of detection of magnetic output, by heating by a heater lamp or cooling by spraying cooling gas such as dry ice, the detection output can be obtained at every desired temperature.

Changing the composition can control the Curie temperature of magnetic powder, for example, by partially replacing Ni or Mn of Ni ferrite or Mn ferrite that is a basic component with Zn or Cd, preferably Zn.

The manufacturing method for magnetic powder for validity determining ink has a step of mixing and dissolving a magnetic oxide and a glass forming material, then cooling the mixture rapidly, and making the magnetic oxide among the mixture amorphous, a step of heat-treating the amorphous magnetic oxide and crystallizing the amorphous magnetic oxide among the mixture, and a step of removing the glass forming material from the crystallized mixture and obtaining magnetic oxide powder with a mean powder particle diameter of 10 μm or less.

As a glass forming material, $B_2O_3$ or $P_2O_5$ can be used.

Figure 2:
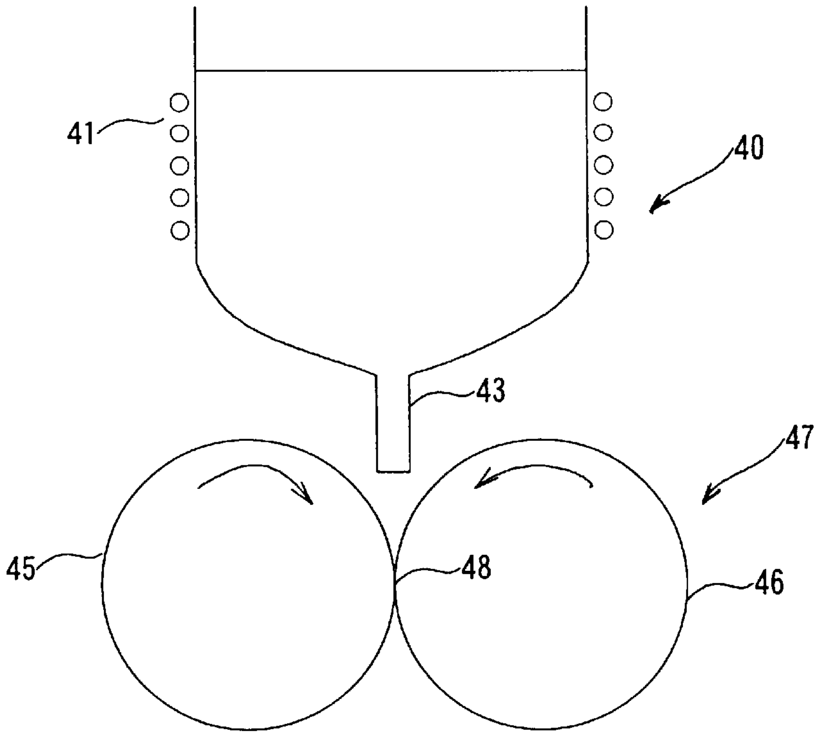
FIG. 2 is a schematic view showing an example of a manufacturing apparatus used in the manufacturing method for magnetic powder of the present invention.

FIG. 2 is a schematic view showing an example of a manufacturing apparatus used in the manufacturing method for magnetic powder of the present invention.

As shown in FIG. 2, the manufacturing apparatus has a platinum crucible 40 having a nozzle 43 at its lower end, a high frequency induction-heating coil 41 arranged around the crucible 40, and a rapid cooler 47 composed of a pair of iron rollers 45 and 46 installed under the nozzle 43.

In an example of the method of the present invention, in the crucible 40, both $B_2O_3$ as a glass forming material and a magnetic oxide material such as NiZn ferrite are housed. By heating up to about 1,400° C. to 1,500° C. by the high frequency induction heating coil 41, the glass forming material and magnetic oxide material are dissolved and mixed. After dissolved and mixed, in the neighborhood of a press contact portion 48 on the rollers 45 and 46 of the rapid cooler 47, the dissolved mixture is ejected. The pair of rollers 45 and 46 are pressed in contact with each other and rotated in the directions of the arrows at high speed so that the rotational direction of the press contact portion 48 is synchronized with the ejection direction of the dissolved mixture. The ejected dissolved mixture is rapidly cooled on the rollers 45 and 46, passes the press contact portion, and is formed as a ribbon-shaped or flake-shaped amorphous material. Then, the obtained amorphous material is heat-treated and crystallized to a magnetic oxide.

The material of the cooler 47 used for rapid cooling of the dissolved mixture is preferable to be, for example, Fe or Cu and the material of the pair of rollers is particularly preferable to be an Fe alloy from the viewpoint of durability. The peripheral speed of the rollers, although depending on the feed amount of a molten material, is preferable to be within the range from 0.1 to 30 m/s. The heat-treating condition, although depending on the composition, is, for example, 10 minutes to 10 hours at 650 to 900° C.

Hereafter, the glass-forming component is removed from the heat-treated mixture by cleaning it using a weak acid solution; for example, a dilute acetic acid and magnetic powder can be taken out.

According to this method, magnetic oxide fine particles are well dispersed in the crystallized mixture because the mutual interfaces of magnetic oxide fine particles are isolated by the glassy phase and after cleaning, magnetic oxide fine particles having an equal particle diameter can be obtained easily.

The mean powder particle diameter of magnetic powder can be controlled, for example, by properly changing the composition ratio of a magnetic oxide and a glass forming material, the peripheral speed of the cooler, and the heat-treating temperature after rapid cooling, and the heat-treatment time.

The printing member for validity determination of the present invention is used to detect a magnetic image indicating magnetic characteristics at a temperature higher than the first Curie temperature of the first magnetic powder and lower than the second Curie temperature of the second magnetic powder and has the first magnetic image printed with the first magnetic ink including the fist magnetic powder having the first Curie temperature and the second magnetic image printed with the second magnetic ink including the second magnetic powder having the second Curie temperature higher than that of the first magnetic powder.

The first and second magnetic images may be such that for example, when one of them is a magnetic background image, the other is a magnetic data image.

Further, on the first magnetic image, the second magnetic image can be overprinted.

Furthermore, the detecting device for the printing member or validity determination has the aforementioned printing member for validity determination, a heater for heating the printing member for validity determination to a temperature higher than the first Curie temperature and lower than the second Curie temperature, and a means for detecting a magnetic data image of the heated printing member for validity determination.

In this case, the first magnetic powder and second magnetic powder are preferable to be magnetic power mainly composed of an iron oxide from the viewpoint of the environmental adaptability and detection. As such an iron oxide, for example, NiZn ferrite, CuZn ferrite, MnZn ferrite, and CuZuMg ferrite may be cited. Particularly, MnZn ferrite, CuZn ferrite, and NiZn ferrite can easily control the Curie temperature and the detection sensitivity thereof is high.

Further, as at least one of the first magnetic powder and second magnetic powder, it is preferable to use oxide magnetic powder practically composed of oxide magnetic powder having a Curie temperature between −50° C. and 150° C. and a mean powder particle diameter of 10 $\mu$m or less relating to the present invention. Such magnetic powder has characteristics that the dispersibility in magnetic ink is satisfactory, and necessary information can be precisely written in a fine position in a predetermined place, and satisfactory durability, high output, and high sensitivity are realized, and the reliability is high.

Particularly, as such an iron oxide, magnetic powder having a mean powder particle diameter of 5 nm to 5 $\mu$m is preferable to be used and in this magnetic powder, the aforementioned characteristics are more satisfactory.

The mean powder particle diameter is more preferably 5 nm to 1 $\mu$m.

Furthermore, by changing the amount of magnetic powder in two kinds of ink to be printed, the detection pattern can be changed.

Further, the means for detecting a magnetic data image can be composed of the first magnetic detecting section and second magnetic detecting section installed at the preceding stage and later stage of the heater respectively.

Furthermore, in the validity determining device of the present invention, a validity determining section for determining the validity from the first detected magnetic pattern by the first magnetic detection section and the second detected magnetic pattern by the second magnetic detection section is additionally installed in the detecting device.

The present invention will be explained in detail hereunder with reference to the accompanying drawings.

Figure 3:
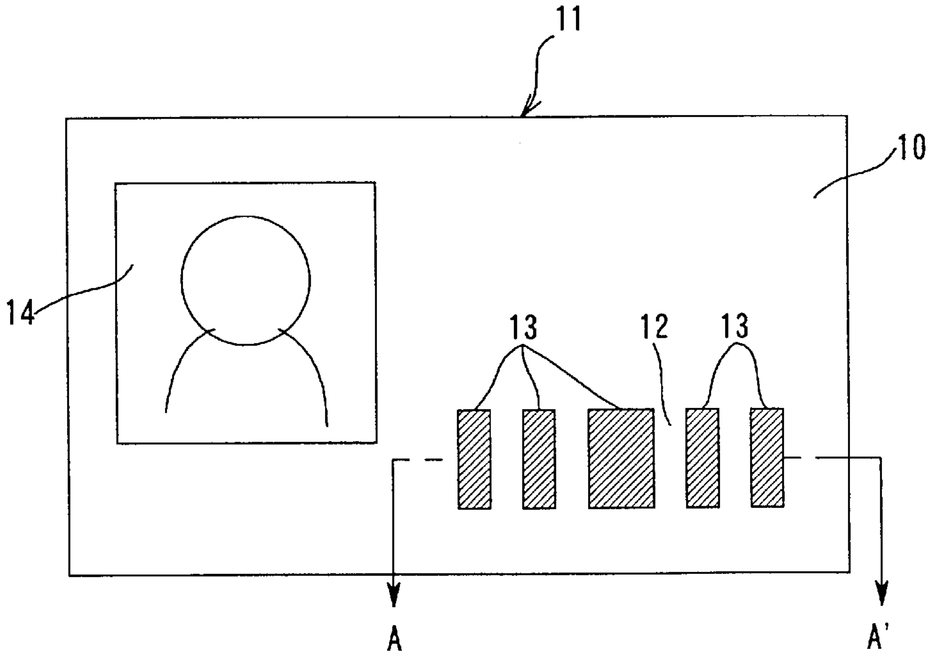
FIG. 3 is a schematic plan view of an individual authentication card that is an example of a printed-paper of the present invention.

FIG. 3 is a schematic view of an individual authentication card that is an example of a printed-paper of the present invention.

An individual authentication card 11 has a magnetic background image 12 printed on a card base 10 at random with the first magnetic ink including the first magnetic powder having a low Curie temperature higher than the room temperature, a magnetic data image 13 in a bar code pattern shape printed on the magnetic background image 12 with the second magnetic ink including the second magnetic powder having a Curie temperature higher than that of the first magnetic powder in correspondence with predetermined information, a face photograph 14 of the said person printed with ordinary color ink, and an authentication number not shown in the drawing.

As mentioned above, on the individual authentication card 11, the face photographs of the said person and authentication number are printed and a security art composed of the magnetic background image 12 and the magnetic data image 13 is additionally provided.

Figure 4:
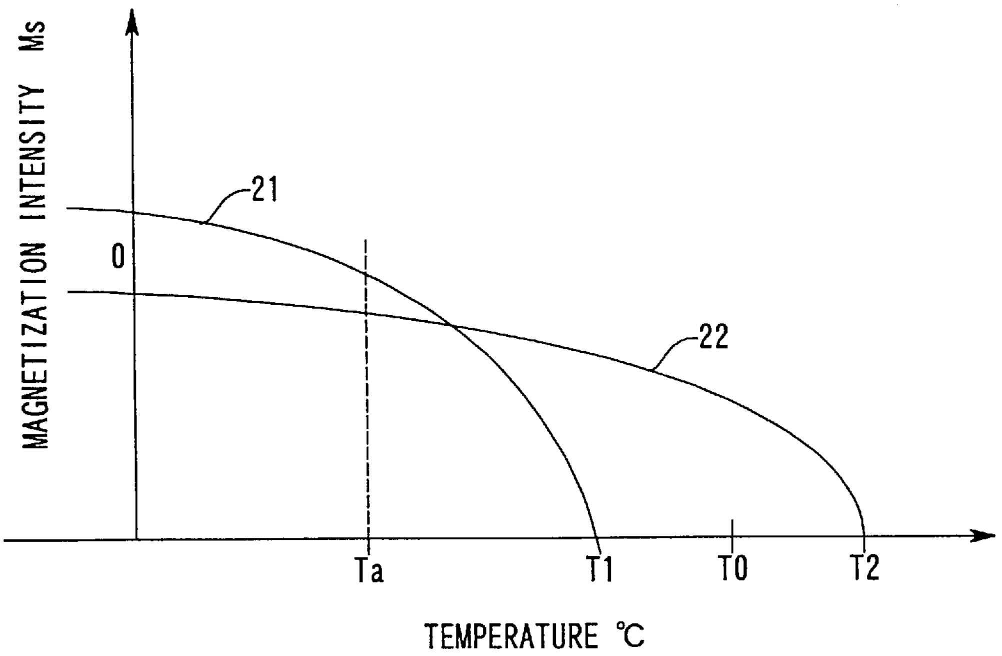
FIG. 4 is a graph showing the relationship between the temperature and the magnetization intensity as a magnetic property of the first magnetic ink and a magnetic property of the second magnetic ink.

FIG. 4 shows a graph indicating the relationship between the temperature and the magnetization intensity as a magnetic property 21 of the first magnetic ink an a magnetic property 22 of the second magnetic ink. Here, Ta indicates a standard room temperature (20 to 30° C.), and T1 indicates the Curie temperature of the first magnetic ink, that is, the temperature at which the magnetization is eliminated, and T2 indicates the Curie temperature of the second magnetic ink, and the first magnetic ink and second magnetic ink are designed so that Ta<T1<T2 is held. The magnetization intensity of the first magnetic ink at the room temperature Ta is preferably higher than the magnetization intensity of the second magnetic ink.

As a combination having such a magnetic property, for example, in $Ni_{1-x}Zn_xFe_2O_4$, there are two kinds of combinations such as x=0.7 and x=0.8. By use of it, two Curie temperatures can be set. Further, in $Mn_{1-x}Zn_yFe_2O_4$, even when y=0.80 and y=0.90 are set, magnetic powder having a different Curie temperature can be set. Furthermore, a combination of different constituent elements, for example, a combination of NiZn ferrite and MnZn ferrite is also acceptable. When these materials are used as magnetic powder, particularly high effects can be obtained.

Figure 5:
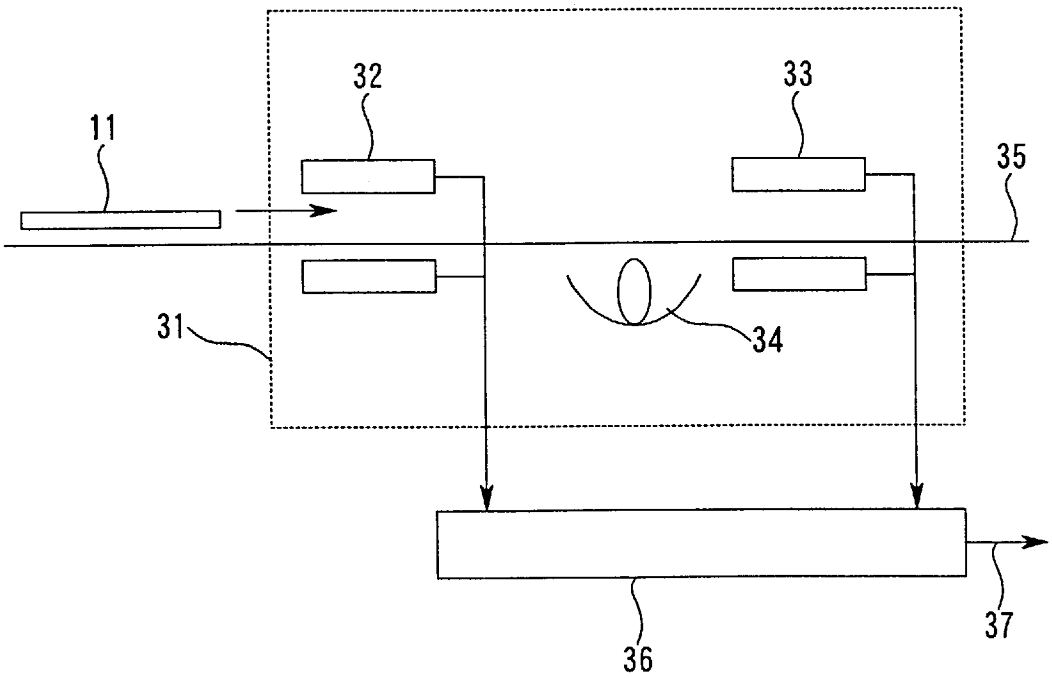
FIG. 5 is a schematic view showing a detecting device of the present invention.
Figure 6:
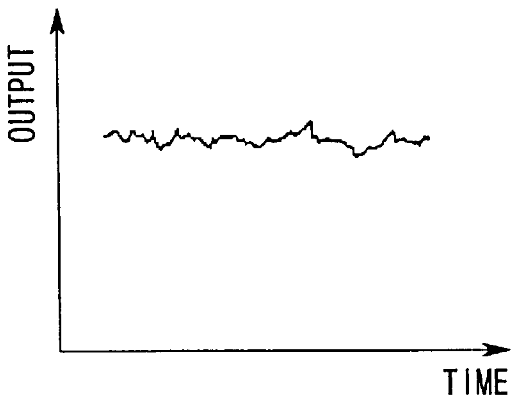
FIG. 6 is a graph showing a detected record at normal temperature.
Figure 7:
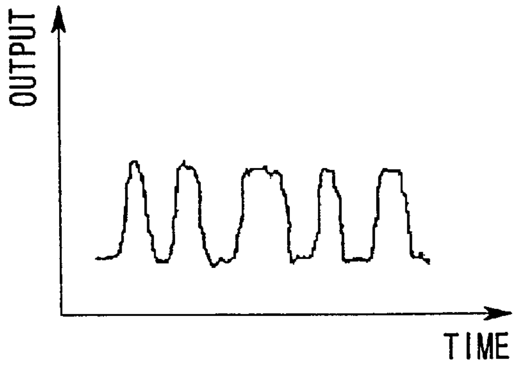
FIG. 7 is a graph showing a detected record at a temperature between the Curie temperature of the first magnetic ink and the Curie temperature of the second magnetic ink.

FIGS. 5 to 7 are drawings for explaining the detecting method for the printing member for validity determination relating to the present invention. FIG. 5 is a schematic view showing a detecting device of the present invention, and FIG. 6 is a graph showing a detected record at the normal temperature Ta, and FIG. 7 is a graph showing a detected record at a temperature To between T1 and T2.

As shown in FIG. 5, a detecting device 31 comprises a conveyor 35 composed of, for example, a belt-shaped member for conveying the same individual authentication card 11 as that shown in FIG. 3, a first sensor 32 composed of a magnetic detecting section, a heater 34 composed of a halogen lamp, and a second sensor 33 composed of a magnetic detecting section. Furthermore, the detecting device 31 has a validity determining section 36 that is connected to the first sensor 32 and the second sensor 33, receives respective detection signals from the first sensor 32 and the second sensor 33, and determines the validity.

The first sensor 32 detects magnetic output at the rough room temperature Ta in the area where the magnetic data image 13 printed with the second magnetic ink in correspondence to predetermined information is overwritten on the magnetic background image 12 printed on the individual authentication card 11 with the first magnetic ink. Thereafter, the area is heated up to a temperature of To between the first Curie temperature and the second Curie temperature by the heater 34 and the magnetic output at that time is detected by the second sensor 33. In this case, the first sensor 32 and the second sensor 33 are arranged at two positions above and below the conveyor 35 respectively so as to increase the SN ratio. As a heater 34, in addition to the halogen lamp, a predetermined heater or a heat roller may be used.

FIGS. 6 and 7 show the detected records by the first sensor 32 and the second sensor 33 in the area A—A' shown in FIG. 3 as graphs indicating the relationship between the time and the magnetic output respectively. The output of the first sensor 32, since the detection temperature is the room temperature Ta, detects the magnetic background image 12 printed with the first magnetic ink at random and the shape of the graph, as shown in FIG. 6, is detected as a noise-shape pattern of high output. On the other hand, since the temperature in the detection area is increased to a temperature of To higher than the Curie temperature T1 of the first magnetic ink, the magnetization of the magnetic background image 12 becomes zero, so that the output of the second sensor 33 can detect the bar code pattern of the magnetic data image 13 overwritten in this area at a high SN ratio.

Furthermore, the magnetic output of the first sensor 32 and the magnetic output of the second sensor 33 are input to the validity determining section 36. In this case, at the room temperature Ta, the noise pattern of high output is increased to a temperature of To, so that from the change in the magnetic output that it can be detected as a predetermined bar code pattern, the validity determining section 36 determines whether the individual authentication card 11 is a true card based on a predetermined specification or not and can send a validity determining signal 37 to a system not shown in the drawing.

The present invention will be explained concretely hereunder by indicating the embodiments.

EMBODIMENT 1 AND COMPARISON EXAMPLE 1

Magnetic powder $Ni_{0.25}Zn_{0.75}Fe_2O_4$ having a mean powder particle diameter of 0.1 $\mu$m and a Curie temperature of 80° C., resin, and dispersant are mixed so as to form ink. A paper is prepared as a base and a bar code is printed on the paper using the obtained magnetic ink. The coercive force of the used magnetic powder is 7110 A/m.

The obtained printed-paper is applied to a validity-determining device having the same constitution as that shown in FIG. 5. Firstly, a signal of the obtained printed-paper is detected using the first sensor 32 composed of a non-contact reading head at room temperature. Thereafter, the printed paper is heated up to 130° C. or more by the heater 34 composed of a heater lamp and immediately after, a signal is detected again using the second sensor 33 composed of a non-contact reading head having the same constitution. As a result, a signal of 22 mVp-p is obtained at room temperature, though in the latter case, no signal is obtained. Even if the operation is repeated 1000 times in a short time, no change is observed in the detected signal.

As Comparison example 1, the same evaluation is made using magnetic ink produced using $CrO_2$ as a magnetic pigment. The obtained output is extremely small and cannot be detected unless it is amplified considerably. When it is evaluated by "3M Viewer" after the temperature is raised up to the Curie temperature or more once, although data erasure can be ascertained surely, it is found that writing and erasure confirmation require a lot of time, thereby validity determination at high speed is difficult.

As mentioned above, it is obvious that for the magnetic ink of the present invention and an article using it, validity determination can be executed easily and quickly.

EMBODIMENT 2 AND COMPARISON EXAMPLE 2

Magnetic powder $Ni_{0.2}Zn_{0.8}Fe_2O_4$ having a mean powder particle diameter of 50 nm, a Curie temperature of 40° C., and coercive force of 9480 A/m and magnetic powder $Ni_{0.25}Zn_{0.75}Fe_2O_4$ having a mean powder particle diameter of 70 nm, a Curie temperature of 80° C., and coercive force of 8000 A/m at a rate of 1:7, resin, and dispersant are mixed so as to form ink. Using the obtained magnetic ink, in the same way as with Embodiment 1, a bar code is printed on a paper. The magnetic powder used is a one produced by the glass crystallization method. A signal of the obtained printed-paper is detected in the same way as with Embodiment 1.

As a result, a signal of 32 mVp-p is obtained at room temperature and a signal of 15 mVp-p is obtained at 60° C., though no signal is obtained under the heating condition. Even if the operation is repeated 1000 times in a short time, no change is observed in the detected signal.

As Comparison example 2, the same evaluation is made using magnetic ink produced using $CrO_2$ with a particle diameter of 20 $\mu$m as a magnetic pigment. In this case, the output is small such as about 0.1 mVp-p and even if the operation is repeated 1000 times, the output is extremely small and cannot be measured.

As mentioned above, high reliability that validity determination can be executed easily for the magnetic ink of the present invention and an article using it and can sufficiently withstand the repetition can be obtained.

EMBODIMENT 3 AND COMPARISON EXAMPLE 3

Magnetic ink A (Embodiment 3) obtained by mixing $Ni_{0.3}Zn_{0.7}Fe_2O_4$ having a mean crystal particle diameter of 80 nm and a Curie temperature of 120° C., resin, and dispersant and magnetic ink B (Comparison example 3) obtained by mixing $Ni_{0.7}Zn_{0.3}Fe_2O_4$ having a Curie temperature of 430° C. or more, a mean crystal particle diameter of 14 $\mu$m, and coercive force of 790 A/m and the same resin and dispersant are prepared respectively. Papers are printed using the obtained two kinds of magnetic ink respectively. The magnetic powder of the embodiment is a one produced by the glass crystallization method and the magnetic powder of the comparison example is a one produced by a method for obtaining magnetic powder by preparing and calcining iron oxide, zinc oxide, and nickel oxide so as to obtain a predetermined ratio.

Figure 8:
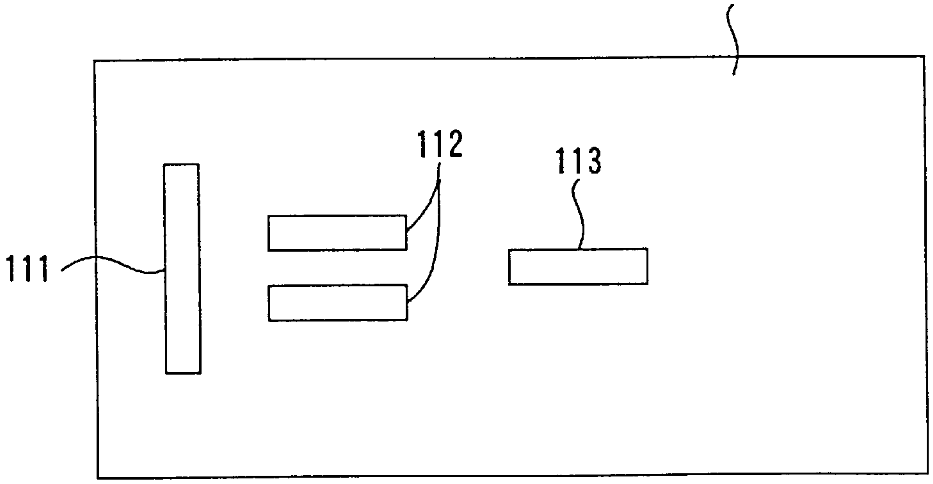
FIG. 8 is a plan view showing another example of a printed-paper for validity determination relating to the present invention.

FIG. 8 is a plan view showing another example of a printed-paper for validity determination relating to the present invention viewed from above. As shown in the drawing, the printed-paper has a predetermined pattern 111 printed on a paper 120 using the magnetic ink B having a high Curie temperature and predetermined patterns 112 and 113 printed using the magnetic ink A having a low Curie temperature. A signal of the obtained printed paper is detected by the first sensor 32 at normal temperature, and then the magnetic ink is heated up to about 150° C. by the heater 34 composed of a heater lamp, and a signal is detected by the second sensor 33 again.

Figure 9:
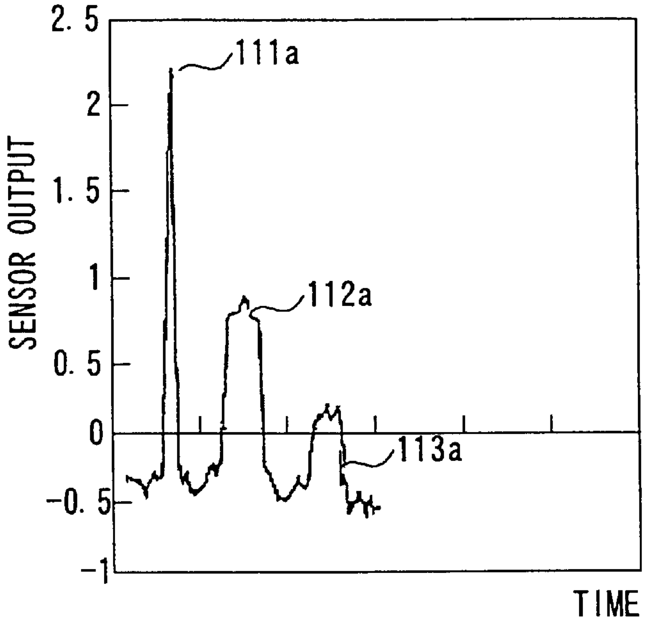
FIG. 9 is a graph showing the waveform of a detected signal obtained by a sensor.
Figure 10:
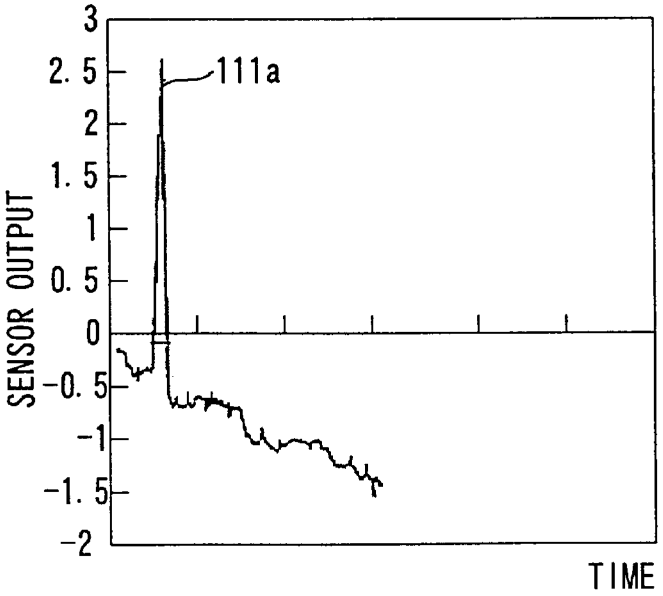
FIG. 10 is a graph showing the waveform of a detected signal obtained by a sensor.

In FIGS. 9 and 10, the waveform of the detected signal obtained by the first sensor 32 and the waveform of the detected signal obtained by the second sensor 33 are shown respectively. In the drawing, numeral 111*a* indicates a peak of the pattern 111 using the magnetic ink B having a high Curie temperature, and numeral 112*a* indicates a peak of the pattern 112 using the magnetic ink A having a low Curie temperature, and numeral 113*a* indicates a peak of the pattern 113 using the magnetic ink A having a low Curie temperature. As shown in the drawings, the peaks 112*a* and 113*a* of the magnetic ink A having a low Curie temperature obtained by the first sensor 32 disappear from the waveform of the detected signal obtained by the second sensor 33.

The detected signals obtained in the aforementioned embodiment can be determined as indicated below.

For example, with respect to the detected waveforms shown in FIGS. 9 and 10, a high-pass filter removes the DC component and the signal waveform in a pulse shape is taken out. From the taken out signal waveforms, the number of pulses at a fixed voltage or higher is counted for the signals before and after heating. By ascertaining that the respective counts are the intrinsic predetermined numbers of the article for validity determination, that is, the value before heating is 3 and the value after heating is 1, the validity can be determined.

Or, after the high-pass filter removes the DC component and the signal waveform in a pulse shape is taken out, the signal is rectified to a DC signal. This DC signal is integrated and compared with the intrinsic predetermined numbers of the article for validity determination in magnitude. Namely, by ascertaining that the value before heating is larger and the value after heating is smaller, the validity can be determined.

EMBODIMENTS 4 AND 5

As a magnetic powder, Ni ferrite is selected, and Zn is selected so as to control the Curie temperature, and $B_2O_3$ is combined and used as a glass forming material, and the composition is changed, and a (Ni, Zn) $Fe_2O_4$ series is produced by way of trial.

Firstly, the raw materials are sufficiently mixed and the mixture is put into a platinum vessel having a nozzle at its end.

Next, the mixture is heated up to 1450° C. by high frequency induction heating, pressured from above the platinum vessel, and put and suddenly cooled on the dual iron rollers with a diameter of 500 cm and a number of revolutions of 500 rpm and an amorphous material with a thickness of about 50 μm is obtained.

The obtained amorphous material is heat-treated in the air at 750° C. for one hour and target fine particles of ferrite are crystallized. The glass forming material of the sample is dissolved and removed by a dilute acetic acid and the remaining powder is cleaned with water and dried.

Among magnetic powder with a particle diameter of 50 to 100 nm expressed by $Ni_{1-x}Zn_xFe_2O_4$, three kinds of X=0.7, 0.75, and 0.8 are mixed at a rate of 1:1:1 so as to form ink. A high-resolution ink jet printer as Embodiment 4 prints a paper using this ink.

Respective kinds of magnetic powder of X=0.7, 0.75, and 0.8 are formed as ink and individual papers are printed in a stripe shape at different positions by the same method as Embodiment 5.

These samples are detected repeatedly by a contact type magnetic head and the durability is ascertained. It is ascertained that no change is found in the output by detection of 1000 times.

Furthermore, the sample of Comparison example 1 is detected repeatedly by the contact type magnetic head in the same way as with Embodiments 4 and 5, and the durability is ascertained, and it is found that when the detection is repeated 1000 times, the output is reduced to about ⅔ of the initial value. The reason is considered as that since the particle diameter of the magnetic powder is comparatively large, powder existing on the surface without entering between fibers of the paper is omitted due to friction with the head caused by high-speed movement.

The magnetic powder for validity determining ink of the present invention is satisfactory in the output and durability, applicable to various printing arts, and high in the reliability, determining speed, and forgery preventive effect.

By the manufacturing method of the present invention for magnetic powder for validity determining ink, magnetic powder having a desired small particle diameter which is satisfactory in the output and durability, applicable to various printing arts, and high in the reliability, determining speed, and forgery preventive effect can be obtained easily.

Furthermore, when the magnetic ink for validity determination of the present invention is used, a printing member for validity determination which is satisfactory in the output and durability, applicable to various printing arts, and high in the reliability, determining speed, and forgery preventive effect can be provided easily.

Furthermore, the printing member for validity determination of the present invention is satisfactory in the output and durability and high in the reliability, determining speed, and forgery preventive effect.

Further, when the detecting device for the printing member for validity determination of the present invention is used, magnetic information that is high in the reliability and forgery preventive effect can be detected easily.

Furthermore, when the validity-determining device of the present invention is used, magnetic information that is high in the reliability and forgery preventive effect is detected and the validity can be determined quickly.

What is claimed is:

1. Magnetic powder for validity determining ink comprising magnetic oxide powder having a Curie temperature between −50° C. and 150° C. and a mean powder particle diameter of 10 μm or less.

2. Magnetic powder according to claim 1, wherein the magnetic oxide powder is ferrite series magnetic powder having coercive force of 20,000 A/m or less.

3. Magnetic powder according to claim 2, wherein the magnetic oxide powder contains nickel ferrite as a main component.

4. Magnetic ink for validity determination including first magnetic powder having a Curie temperature between −50° C. and 150° C. and a mean powder particle diameter of 10 μm or less.

5. Magnetic ink according to claim 4, wherein the magnetic ink further includes second magnetic powder having a second Curie temperature different from the first Curie temperature.

6. Magnetic ink according to claim 4, wherein the magnetic ink further includes second magnetic powder having second coercive force different from first coercive force of the first magnetic powder.

* * * * *